(12) United States Patent
Van Den Bos et al.

(10) Patent No.: US 8,554,158 B2
(45) Date of Patent: Oct. 8, 2013

(54) CURRENT SAVING BY REDUCED MODULATION CODE AND SELECTIVE GATING OF RF SIGNAL

(75) Inventors: Norbert Van Den Bos, Wijchen (NL); Roeland Heijna, Nijmegen (NL); Hendrik Visser, Wijchen (NL)

(73) Assignee: ST-Ericsson SA, Plan-les-Ouates (CH)

( * ) Notice: Subject to any disclaimer, the term of this patent is extended or adjusted under 35 U.S.C. 154(b) by 204 days.

(21) Appl. No.: 13/248,371

(22) Filed: Sep. 29, 2011

(65) Prior Publication Data
US 2012/0081183 A1    Apr. 5, 2012

Related U.S. Application Data

(60) Provisional application No. 61/388,318, filed on Sep. 30, 2010.

(51) Int. Cl.
H04B 1/04 (2006.01)
H04B 1/38 (2006.01)

(52) U.S. Cl.
USPC ............. 455/102; 455/115.1; 455/127.1; 455/574

(58) Field of Classification Search
USPC ......... 455/41.1, 41.2, 102, 115.1, 115.3, 126, 455/127.1, 127.2, 127.3, 574; 330/297, 310
See application file for complete search history.

(56) References Cited

U.S. PATENT DOCUMENTS

| | | | |
|---|---|---|---|
| 4,947,455 A | 8/1990 | Swanson | |
| 5,126,688 A * | 6/1992 | Nakanishi et al. | 330/285 |
| 5,132,637 A | 7/1992 | Swanson | |
| 5,392,007 A | 2/1995 | Cripe | |
| 6,256,482 B1 * | 7/2001 | Raab | 455/102 |
| 6,445,248 B1 | 9/2002 | Gilbert | |
| 6,470,045 B1 * | 10/2002 | Fuentes | 375/220 |
| 6,927,719 B1 | 8/2005 | Siniscalchi | |
| 7,184,490 B1 | 2/2007 | Rybicki et al. | |
| 7,187,314 B1 | 3/2007 | Beamish et al. | |
| 7,463,869 B2 | 12/2008 | Hung et al. | |
| 7,509,102 B2 * | 3/2009 | Rofougaran et al. | 455/127.1 |
| 7,817,962 B2 * | 10/2010 | Zolfaghari | 455/127.3 |
| 2005/0062529 A1 | 3/2005 | Gan et al. | |
| 2008/0136511 A1 | 6/2008 | Zolfaghari | |

FOREIGN PATENT DOCUMENTS

DE    3632715 A1    4/1987

(Continued)

OTHER PUBLICATIONS

Hernández, H. et al. "A small area 8-bits 50 MHz CMOS DAC for Bluetooth transmitter." Analog Integrated Circuits and Signal Processing (Springer), 2008, vol. 57, pp. 69-77.

*Primary Examiner* — Quochien B Vuong
(74) *Attorney, Agent, or Firm* — Coats & Bennett, P.L.L.C.

(57) ABSTRACT

A polar modulation power amplifier employs both thermometer coded and binary coded amplitude modulation data. The thermometer coded amplitude modulation data selectively activates one or more equally weighted power amplifier cells. The binary coded amplitude modulation data selectively activates one or more binary weighted power amplifier cells. When less than full output power is required and the MSBs of the amplitude modulation data are zero (reducing output power at the expense of quantization noise), the power dissipated by RF signal buffers for the unused power amplifier cells corresponding to the MSBs is substantially reduced by gating off the RF signal upstream of the buffers.

13 Claims, 4 Drawing Sheets

(56) References Cited

FOREIGN PATENT DOCUMENTS

| | | | |
|---|---|---|---|
| EP | 0083727 | A1 | 7/1983 |
| EP | 0725478 | A1 | 8/1996 |
| EP | 0887924 | A2 | 12/1998 |
| JP | 2002-344243 | | 11/2002 |
| KR | 2002-0012909 | A | 2/2002 |
| WO | 2006113030 | A2 | 10/2006 |

* cited by examiner

CURRENT SAVING BY REDUCED MODULATION CODE AND SELECTIVE GATING OF RF SIGNAL

This application claims priority from U.S. Provisional Patent Application Ser. No. 61/388,318, filed Sep. 30, 2010, titled, "Current Saving by Reduced Modulation Code and Disabled Clock Buffers," the disclosure of which is incorporated herein by reference in its entirety.

TECHNICAL FIELD

The present invention relates generally to wireless communication transmitter power amplifiers, and in particular to a method of controlling high frequency clock buffers in a power amplifier to reduce power consumption.

BACKGROUND

Bluetooth® is an open standard for creating and exchanging data over ad hoc short-range wireless communication networks. Developed by Ericsson in 1994, Bluetooth has become a standard feature of many wireless communication terminals, as well as many other types of portable electronic devices. A design goal of all portable electronic devices is to reduce power consumption, thus prolonging battery life.

A digitally modulated transmitter power amplifier for a Bluetooth system uses polar modulation, with phase information modulated onto a high frequency periodic signal (clock) on the carrier frequency, and digital coded amplitude modulation. The number of bits used for the amplitude modulation is related to the Digital to Analog Converter (DAC) quantization noise allowed according to the specification.

The number of bits used for modulation relates to the number of circuits needed, all switched on a high frequency clock. High frequency switching consumes relatively large currents and hence increases power consumption. Reducing the number of modulation bits reduces the supply power consumption; however, this increases the quantization noise, and vice versa.

The carrier frequency noise specification for a Bluetooth output signal is an absolute specification. This means the noise specification is toughest on the maximum output power, which defines the minimum number of modulation bits needed in this case. The number of modulation bits can be reduced when lower than maximum output power is required. The lower number of modulation bits causes the Most Significant Bit (MSB) cells of the power amplifier to be disabled, because these MSB data bits have a value "zero." However, the high frequency clock buffers for these unused MSB cells, when still active, do dissipate power. This wasted power increases power consumption, increases heat that must be dissipated, and decreases the useable battery life of portable devices.

SUMMARY

According to one or more embodiments described herein, a polar modulation power amplifier employs both thermometer coded and binary coded amplitude modulation data. The thermometer coded amplitude modulation data selectively activates one or more equally weighted power amplifier cells. The binary coded amplitude modulation data selectively activates one or more binary weighted power amplifier cells. When less than full output power is required and the MSBs of the amplitude modulation data are zero (reducing output power at the expense of quantization noise), the power dissipated by RF signal buffers for the unused power amplifier cells corresponding to the MSBs is substantially reduced by gating off the RF signal upstream of the buffers.

One embodiment relates to a method of reducing power consumption in a wireless communication transmitter power amplifier. A phase-modulated radio frequency periodic signal is provided to a plurality of power amplifier cells. Digital amplitude modulation data is received. A first plurality of the modulation data bits is thermometer coded. One or more equally weighted power amplifier cells are selectively activated based on the thermometer coded modulation data bits. A second plurality of the modulation data bits is binary coded. One or more binary weighted power amplifier cells are selectively activated based on the binary coded modulation data bits. An output power requirement indication is received. If the output power requirement exceeds a predetermined threshold, the phase-modulated radio frequency periodic signal is enabled to all of the power amplifier cells. If the output power requirement is less than the threshold, the phase-modulated radio frequency periodic signal is selectively gated upstream of one or more final buffers associated with inactive power amplifier cells, to eliminate switching current in the buffers.

Another embodiment relates to a power amplifier for a wireless communication transmitter. The amplifier includes control circuits operative to receive digital amplitude modulation data and an output power requirement indication, and generate digital power amplifier cell enable data. The amplifier also includes a plurality of gating signal drivers operative to receive a phase-modulated radio frequency periodic signal, and to generate a plurality of gated phase-modulated radio frequency periodic signals. Each gating signal driver includes a final buffer, and a logic gate upstream of the final buffer. The logic gate receives the phase-modulated radio frequency periodic signal and one bit of the digital power amplifier cell enable data. The amplifier further includes an encoder operative to thermometer code a first plurality of the modulation data bits and to binary code a second plurality of the modulation data bits. The amplifier additionally includes a plurality of evenly weighted power amplifier cells each adapted to receive a corresponding one of the plurality of gated phase-modulated radio frequency periodic signal and a thermometer coded modulation data bit, and operative to selectively amplify the gated phase-modulated radio frequency periodic signal if activated by the thermometer coded modulation data bit. The amplifier also includes a plurality of binary weighted power amplifier cells each adapted to receive a corresponding one of the plurality of gated phase-modulated radio frequency periodic signal and a binary coded modulation data bit, and operative to selectively amplify the gated phase-modulated radio frequency periodic signal if activated by the binary coded modulation data bit. The control circuits are further operative to selectively gate the phase-modulated radio frequency periodic signal upstream of the final buffer via the digital power amplifier cell enable data if the output power requirement is less than a threshold, to eliminate switching current in the final buffer.

DETAILED DESCRIPTION

Figure 1:
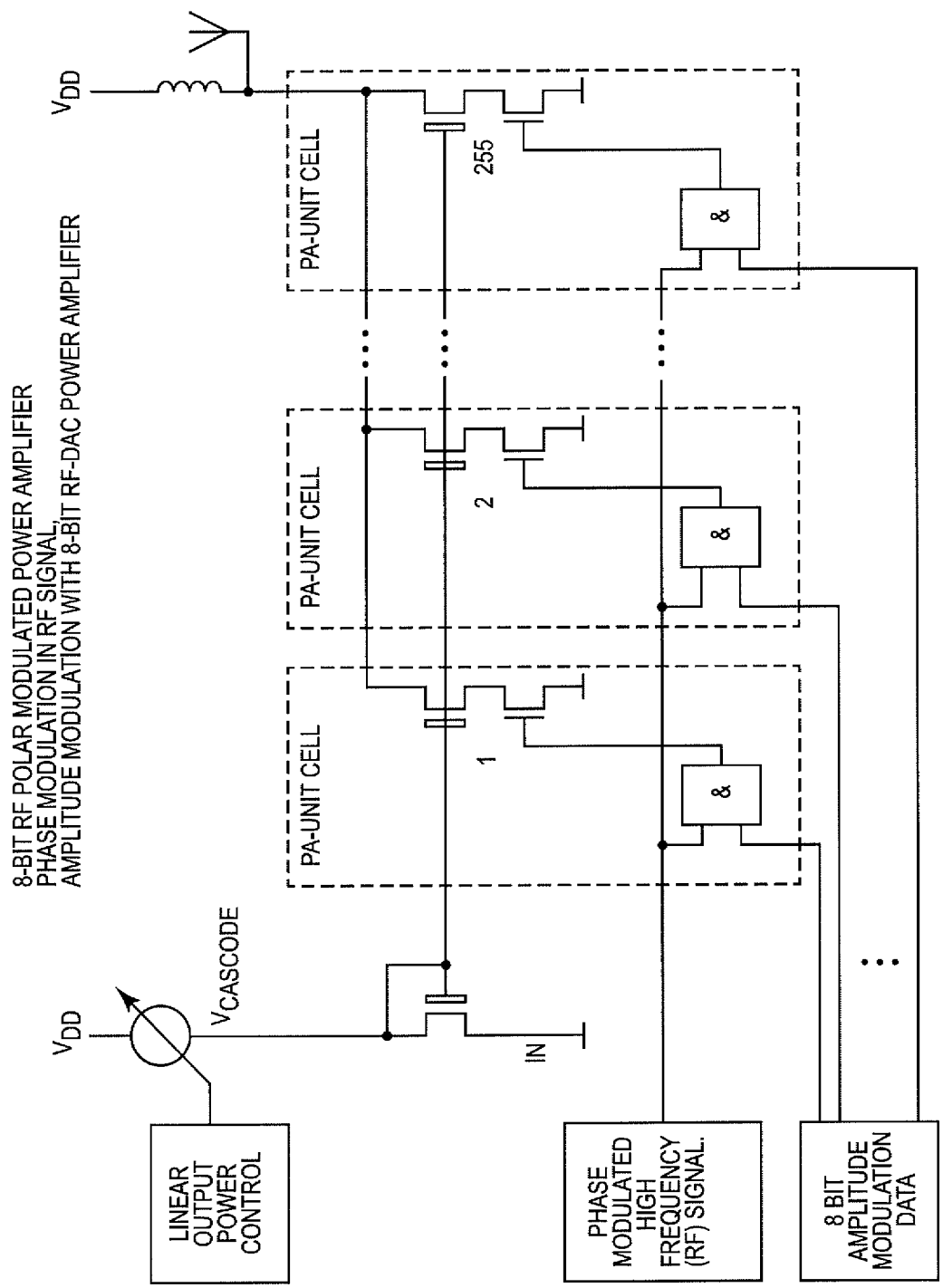
FIG. 1 is a functional block diagram of power amplifier cells in a transmitter.

FIG. 1 depicts one implementation of a polar modulated power amplifier output stage in a Bluetooth transmitter. The transmitter phase modulates a radio frequency (RF) periodic signal, and impresses an 8-bit amplitude modulation on the RF signal. In particular, the amplitude modulation data is thermometer coded, generating 255 bits, and combined with the phase-modulated RF signal in each of 255 power amplifier cells, as depicted in FIG. 1. By selectively gating off the RF signal in each individual power amplifier cell, the sum output strength of the RF signal changes, achieving amplitude modulation.

If less than full output power is required, the number of active thermometer coded modulation bits is reduced, since the MSBs are zero, and not as many power amplifier cell are operative. This reduces the output current, which can be compensated by increasing the linear controlled current on the "cascode" node.

Figure 2:
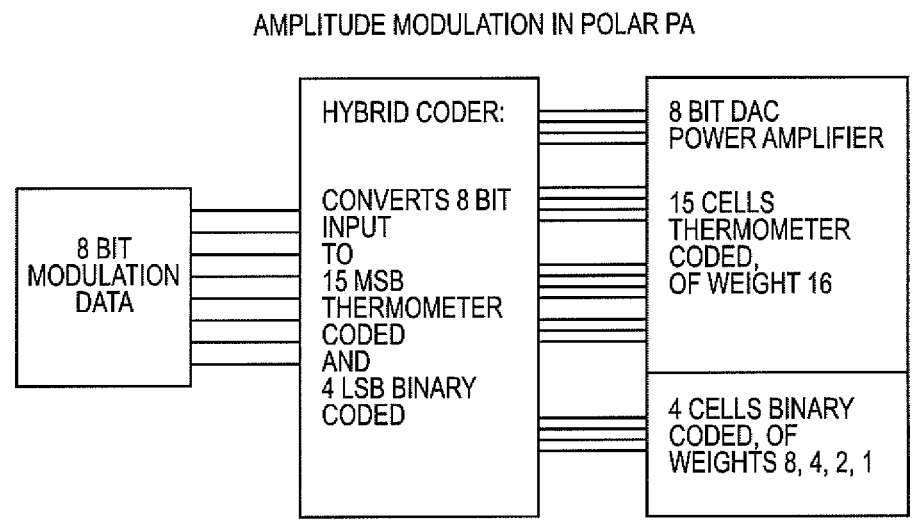
FIG. 2 is a block diagram depicting modulation coding conversion for a transmitter power amplifier.

FIG. 2 depicts another embodiment of a polar modulated power amplifier output stage appropriate for a Bluetooth transmitter. In this embodiment, the 8-bit amplitude modulation data is encoded partly in binary and partly in thermometer code. In particular, the four LSBs are binary coded, and the 15 MSBs are thermometer coded. These bits then gate the phase-modulated RF signal in appropriately weighted power amplifier cells. That is, the power amplifier cells receiving binary coded amplitude modulation bits are weighted with values of 8, 4, 2, and 1. The power amplifier cells receiving thermometer coded amplitude modulation bits are equally weighted, with a weight of 16. Thus, the embodiment of FIG. 2 employs only 19 power amplifier cells rather than 255. This is a trade-off of area, power dissipation, and matching, which achieves adequate performance.

The phase-modulated RF signal requires sufficient drive strength to ensure steep signal slopes and that the phase-noise is within specification, and thus must be buffered with sufficiently sized drivers. When full output power is required, all power amplifier cells are active. However, when lower output power is acceptable—e.g., when the required output power is below a threshold value—the RF signal is gated off in some of the power amplifier cells, as the amplitude modulation data includes zeros in the MSB positions. These cells do not contribute to the amplifier output. However, the large buffers driving the phase-modulated RF signal to these amplifier cells still consume large amounts of current, as the RF signal switches.

Figure 3:
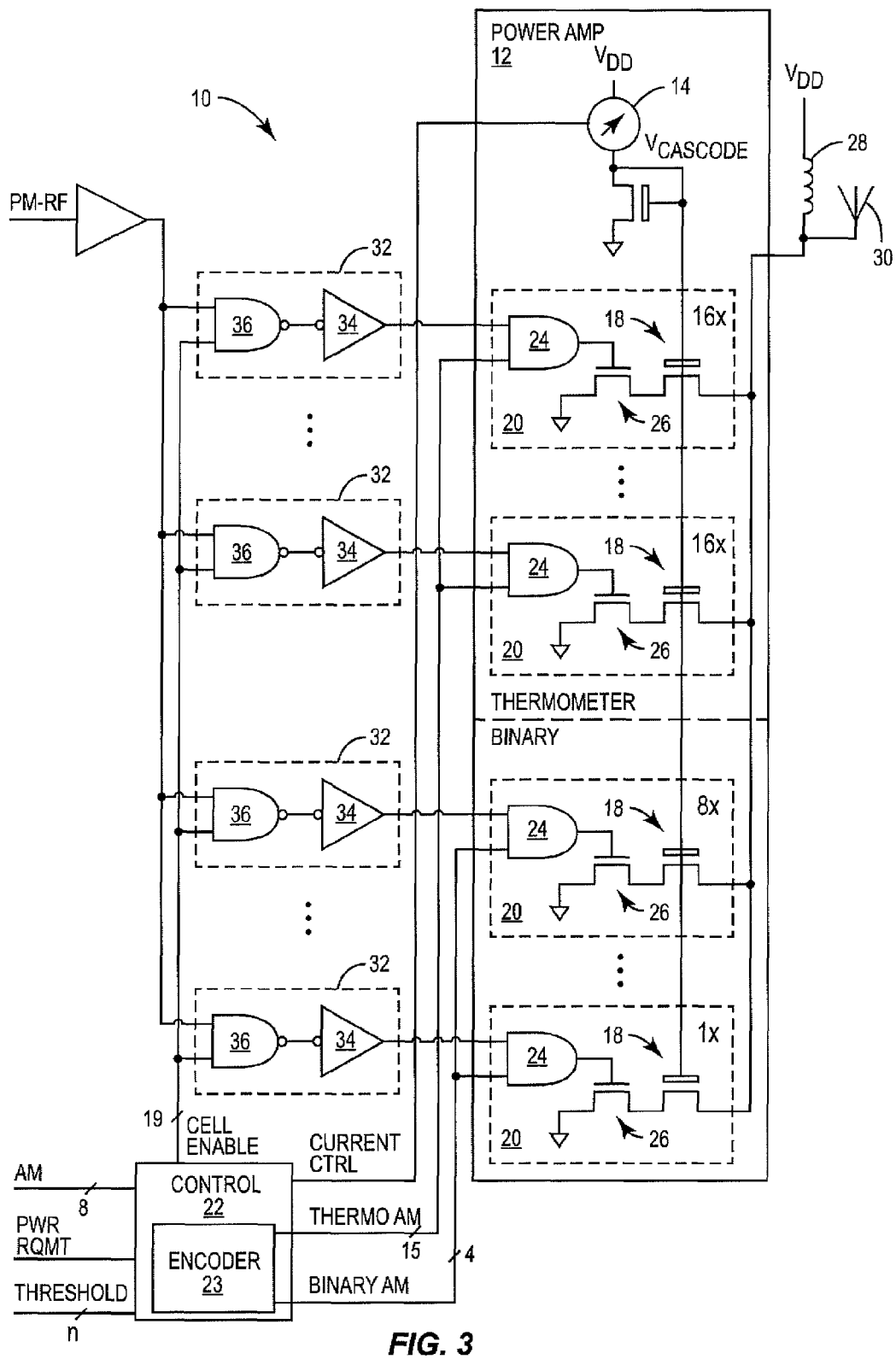
FIG. 3 is a functional schematic diagram of a power amplifier with gating RF signal drivers.

FIG. 3 depicts an embodiment of a polar modulated power amplifier output stage 10 in which still greater power savings are achieved, in conditions under which less than full output power is required, by gating off the phase-modulated RF signal prior to its final buffering for disabled power amplifier cells.

A power amplifier 12 includes a variable current source 14, controlled by a controller 22 and driving a cascode transistor 16. The cascode transistor 16 is connected to current buffers 18 in each power amplifier cell 20. The power amplifier cells 20, each having a weighting factor (e.g., 16×, 8×, 1×), are active or not based on amplitude modulation data. A controller 22 receives 8-bit amplitude modulation data and generates a 15-bit thermometer coded amplitude modulation word and a 4-bit binary coded amplitude modulation word. One bit from the relevant modulation word is ANDed with a phase modulated RF periodic signal at the carrier frequency, in AND gates 24. The output of the AND gate—i.e., either the RF signal or zero—is connected to the gate of control transistor 26, which controls whether or not the relevant power amplifier cell 20 contributes to the total signal output. The total output—comprising a phase- and amplitude-modulated RF signal—is summed at a load inductance 28 and broadcast via antenna 30.

An array RF signal drivers 32 each include a relatively large final buffer 34, which in this embodiment is configured as an inverter. A NAND gate 36 precedes each final buffer 34. The NAND gate receives the phase-modulated RF signal, and one bit of a digital power amplifier cell enable word generated by the controller 22. The NAND gate 36 and digital power amplifier cell enable word selectively disable individual power amplifier cells 20 by blocking the phase-modulated RF signal before it reaches the final buffer 34—saving the significant current that would otherwise be wasted by high speed switching in the buffers 34 driving at least some of the power amplifier cells 20 that will not contribute to the power amplifier 12 total output.

The 19-bit digital power amplifier cell enable word is generated by the controller 22, and is coordinated with the amplitude modulation data to gate off the phase-modulated RF signal to at least some of the power amplifier cells 20 for which the amplitude modulation data is zero. In general, the power amplifier cell enable word will gate the MSBs of amplitude modulation data when full power is not required, and the quantization noise is increased by using fewer bits for amplitude modulation. However, in some embodiments, the phase-modulated RF signal may be gated off for power amplifier cells 20 other than the MSB, such as those power amplifier cells 20 for which the appropriately-coded amplitude modulation bit is zero.

The controller 22 may comprise a state machine implemented as a dedicated hardware circuit or programmable logic with appropriate firmware; one or more software modules executing on a processor or Digital Signal Processor; or some combination thereof. Note that in some embodiments, functionality depicted as residing in the controller 22 may exist elsewhere, and conversely other functions (such as phase modulation of the RF signal) may be include in the controller 22. The controller 22 receives 8-bit amplitude modulation data, from which it generates a 15-bit thermometer coded amplitude modulation word and a 4-bit binary coded amplitude modulation word. The controller also receives an indication of the required output power, and either receives one or more threshold values or has thresholds pre-configured. Different output power threshold values may apply in different transmission situations (i.e., power savings at the expense of amplitude modulation quantization error may or may not be allowed or desired for the same absolute output power level, depending on other factors, such as the operating mode, specified noise floor, and the like). If the required output power exceeds an applicable threshold, the controller enables all of the RF signal drivers 32, providing a phase-modulated RF signal to each power amplifier cell 20. If the required output power is less than the applicable threshold, the controller gates off the phase-modulated RF signal from one or more final buffers 34, each gated driver 32 associated with a power amplifier cell 20 that is inactive due to a zero in its respective bit of the thermometer or binary coded amplitude modulation word.

Figure 4:
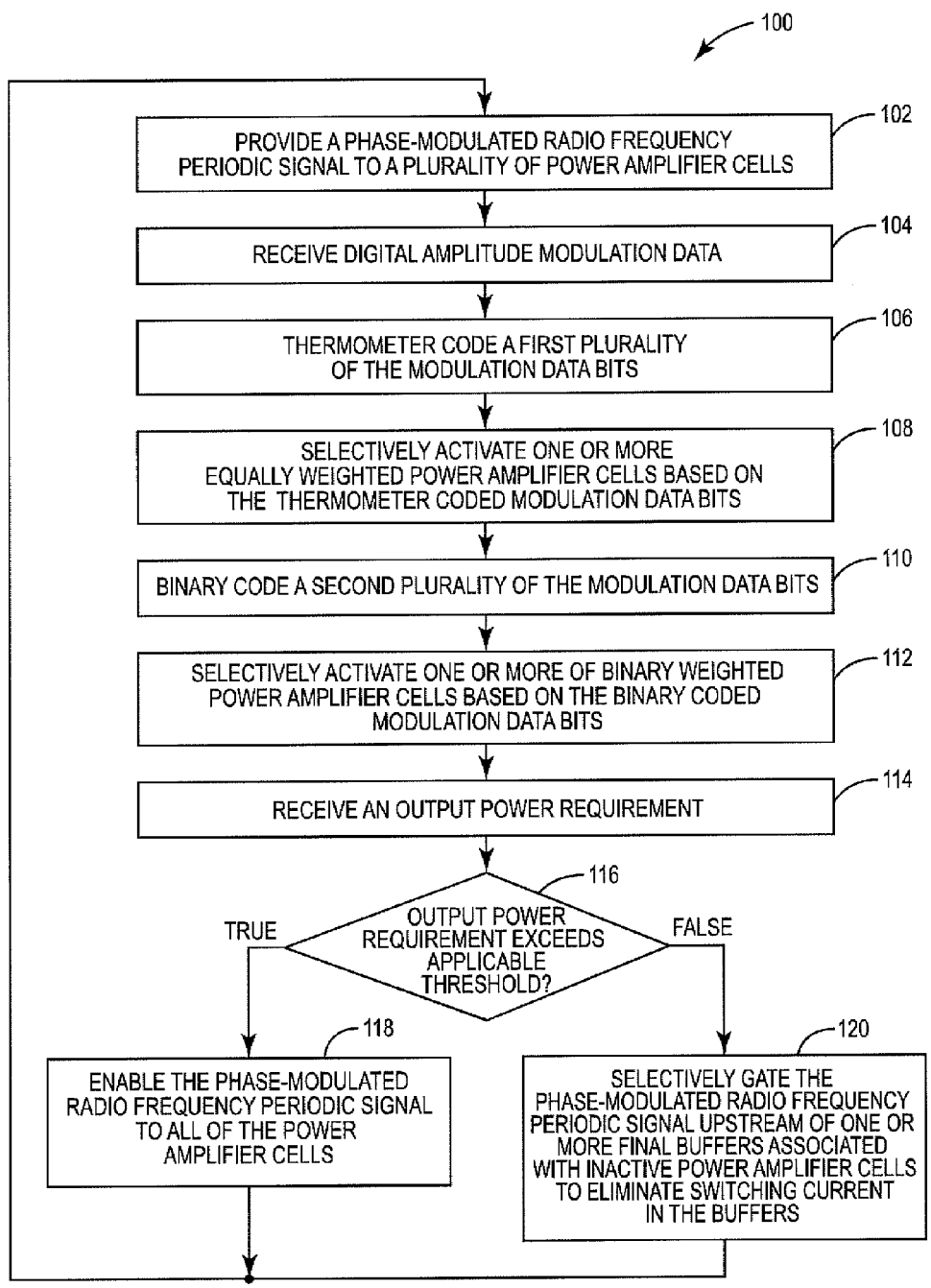
FIG. 4 is a flow diagram of a method of reducing power consumption by a transmitter power amplifier.

FIG. 4 depicts a method 100 of reducing power consumption in a polar modulated power amplifier output stage. A phase-modulated RF signal is provided to a plurality of power amplifier cells 20 (block 102). The controller 22 receives digital amplitude modulation data (block 104). The controller 22 thermometer codes a first plurality of the modulation data bits (block 106), and selectively activates one or more equally weighted power amplifier cells 20 based on the thermometer coded modulation data bits (block 108). The controller 22 binary codes a second plurality of the modulation data bits (block 110), and selectively activates one or more binary weighted power amplifier cells 20 based on the binary coded modulation data bits (block 112). The controller 22 receives an output power requirement indication (block 114). If the output power requirement exceeds a predetermined threshold (block 116), the controller 22 enables the phase-modulated RF signal to all of the power amplifier cells 20 (block 118). If the output power requirement does not exceed the threshold (block 116), the controller 22 selectively gates the phase-modulated RF signal upstream of one or more final buffers 34 associated with inactive power amplifier cells 20, to eliminate switching current in the buffers.

The amplitude modulation data is quantified in 8 bits to meet the Adjacent Channel Power Ratio (ACPR) specification for Enhanced Data Rate (EDR) at +10 dBm. The output power is the product of the amplitude modulation value and the bias current applied to the cascode node. The same output power can be reached by different combinations of these factors. For example:

EDR=10 dBm 8-bits (best ACPR with lowest quantization noise; meets FCC/ETSI specifications with margin; 8 mA in drive)

EDR=10 dBm 7.5-bits (meets ACPR specifications with reduced current; 6 mA in drive) (the 7.5-bits results from 8 bits created by 15 thermometer cells 20 of weight 16 and four binary cells 20 of weights 8, 4, 2, and 1)

EDR=4 dBm 7-bits (4 mA in drive)

EDR=4 dBm 6-bits (2 mA in drive)

BDR=13 dBm 7-bits (no ACPR issue as amplitude modulation is constant; 4 mA in drive)

BDR=13 dBm 6-bits (no ACPR issue as amplitude modulation is constant; 2 mA in drive)

Embodiments of the polar modulated power amplifier output stage described herein present numerous advantages over the prior art. Selectively gating the phase-modulated RF signal for MSBs of the amplitude modulation data, together with a reduction of the number of modulation bits, realizes a trade-off between noise specification and necessary supply power. Especially when functioning at less than maximum output power (which is the case most of the time) efficiency is increased substantially, and an increase in battery lifetime is realized. In Basic Data Rate (BDR) mode, no amplitude modulation is used. In this case, the lowest number of bits necessary to generate the output power can be used, making optimal use of embodiments of the present invention. This BDR mode is used at each header of the transfer protocol of the Bluetooth system. The FCC/ETCI specifications primarily relate to absolute levels on ACPR. At lower power levels, more quantization noise can be introduced, and still meet the regulations. Additionally, the added circuitry required to implement the RF signal gating does not add noticeable power dissipation, and requires very low extra layout area.

Although described herein with reference to a Bluetooth transmitter, embodiments of the present invention are not restricted or limited to that application, and may be advantageously employed in any transmitter where modulation code manipulation and disabling high speed clock buffers may reduce power consumption.

The present invention may, of course, be carried out in other ways than those specifically set forth herein without departing from essential characteristics of the invention. The present embodiments are to be considered in all respects as illustrative and not restrictive. As such, the present invention is not limited by the foregoing description and accompanying drawings. Instead, the present invention is limited only by the following claims and their legal equivalents.

What is claimed is:

1. A method of reducing power consumption in a wireless communication transmitter power amplifier, comprising:
   providing a phase-modulated radio frequency periodic signal to a plurality of power amplifier cells;
   receiving digital amplitude modulation data;
   thermometer coding a first plurality of the modulation data bits;
   selectively activating one or more equally weighted power amplifier cells based on the thermometer coded modulation data bits;
   binary coding a second plurality of the modulation data bits;
   selectively activating one or more binary weighted power amplifier cells based on the binary coded modulation data bits;
   receiving an output power requirement indication;
   if the output power requirement exceeds a predetermined threshold, enabling the phase-modulated radio frequency periodic signal to all of the power amplifier cells; and
   if the output power requirement is less than the threshold, selectively gating the phase-modulated radio frequency periodic signal upstream of one or more final buffers associated with inactive power amplifier cells, to eliminate switching current in the buffers.

2. The method of claim 1 wherein selectively activating one or more equally weighted power amplifier cells based on the thermometer coded modulation data bits comprises selectively activating a plurality of equally weighted power amplifier cells based on the thermometer coded modulation data bits.

3. The method of claim 1 wherein selectively activating one or more binary weighted power amplifier cells based on the thermometer coded modulation data bits comprises selectively activating a plurality of binary weighted power amplifier cells based on the thermometer coded modulation data bits.

4. The method of claim 1 wherein the current through each power amplifier cell is regulated by a cascode transistor, and further comprising, if the output power requirement is less than the threshold, adjusting the current through the active power amplifier cells via the cascode transistor to maintain a desired output power.

5. The method of claim 1 wherein the first plurality of the modulation data bits comprise the most significant bits of the modulation data and the second plurality of the modulation data bits comprise the least significant bits of the modulation data.

6. The method of claim 1 wherein selectively gating the phase-modulated radio frequency periodic signal upstream of one or more final buffers comprises
   providing digital power amplifier cell enable data; and
   wherein providing a phase-modulated radio frequency periodic signal to a plurality of power amplifier cells comprises logically gating the phase-modulated radio frequency periodic signal with each bit of the digital power amplifier cell enable data and providing each gated phase-modulated radio frequency periodic signal to each power amplifier cell.

7. The method of claim 1 wherein
   the plurality of power amplifier cells is nineteen cells;
   the digital amplitude modulation data is 8 bits;

the first plurality of thermometer coded modulation data bits is 15 bits and the plurality of equally weighted power amplifier cells is 15 cells; and the second plurality of binary coded modulation data bits is 4 bits and the plurality of binary weighted power amplifier cells is 4 cells.

8. The method of claim 7 wherein the 15 evenly weighted power amplifier cells have a weight of 16, and the 4 binary weighted power amplifier cells have weights of 8, 4, 2, and 1.

9. A power amplifier output stage for a wireless communication transmitter, comprising:

control circuits operative to receive digital amplitude modulation data and an output power requirement indication, and generate digital power amplifier cell enable data;

a plurality of gating signal drivers operative to receive a phase-modulated radio frequency periodic signal, and to generate a plurality of gated phase-modulated radio frequency periodic signals, each gating signal drivers including a final buffer; and a logic gate upstream of the final buffer, the logic gate receiving the phase-modulated radio frequency periodic signal and one bit of the digital power amplifier cell enable data;

an encoder operative to thermometer code a first plurality of the modulation data bits and to binary code a second plurality of the modulation data bits;

a plurality of evenly weighted power amplifier cells each adapted to receive a corresponding one of the plurality of gated phase-modulated radio frequency periodic signal and a thermometer coded modulation data bit, and operative to selectively amplify the gated phase-modulated radio frequency periodic signal if activated by the thermometer coded modulation data bit; and a plurality of binary weighted power amplifier cells each adapted to receive a corresponding one of the plurality of gated phase-modulated radio frequency periodic signal and a binary coded modulation data bit, and operative to selectively amplify the gated phase-modulated radio frequency periodic signal if activated by the binary coded modulation data bit;

wherein the control circuits are further operative to selectively gate the phase-modulated radio frequency periodic signal upstream of the final buffer via the digital power amplifier cell enable data if the output power requirement is less than a threshold, to eliminate switching current in the final buffer.

10. The amplifier output stage of claim 9 further comprising a cascode transistor operative to regulate the current through each power amplifier cell, and wherein the control circuits are further operative, if the output power requirement is less than the threshold, to adjust the current through the active power amplifier cells via the cascode transistor to maintain a desired output power.

11. The amplifier output stage of claim 9 wherein the first plurality of the modulation data bits comprise the most significant bits of the modulation data and the second plurality of the modulation data bits comprise the least significant bits of the modulation data.

12. The amplifier output stage of claim 9 wherein the first plurality of thermometer coded modulation data bits is 15 bits and the plurality of evenly weighted power amplifier cells is 15 cells;

the second plurality of binary coded modulation data bits is 4 bits and the plurality of binary weighted power amplifier cells is 4 cells;

the digital amplitude modulation data is 8 bits; and the digital power amplifier cell enable data is 19 bits.

13. The amplifier output stage of claim 12 wherein the 15 evenly weighted power amplifier cells have a weight of 16, and the 4 binary weighted power amplifier cells have weights of 8, 4, 2, and 1.

* * * * *

UNITED STATES PATENT AND TRADEMARK OFFICE
CERTIFICATE OF CORRECTION

PATENT NO. : 8,554,158 B2  
APPLICATION NO. : 13/248371  
DATED : October 8, 2013  
INVENTOR(S) : Norbert Van Den Bos, Roeland Heijna and Hendrik Visser Page 1 of 1

It is certified that error appears in the above-identified patent and that said Letters Patent is hereby corrected as shown below:

In the Claims

In Column 6, Line 39, delete "thermometer" and insert -- binary --, therefor.

In Column 6, Line 41, delete "thermometer" and insert -- binary --, therefor.

Signed and Sealed this  
Third Day of March, 2015

Michelle K. Lee  
*Deputy Director of the United States Patent and Trademark Office*